US011706926B2

(12) United States Patent
Kim

(10) Patent No.: US 11,706,926 B2
(45) Date of Patent: Jul. 18, 2023

(54) METHOD OF MANUFACTURING A SEMICONDUCTOR MEMORY DEVICE

(71) Applicant: SK hynix Inc., Icheon-si (KR)

(72) Inventor: Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/338,083

(22) Filed: Jun. 3, 2021

(65) Prior Publication Data

US 2021/0296344 A1   Sep. 23, 2021

Related U.S. Application Data

(63) Continuation of application No. 16/653,618, filed on Oct. 15, 2019, now Pat. No. 11,056,499.

(30) Foreign Application Priority Data

Mar. 26, 2019 (KR) .................. 10-2019-0034681

(51) Int. Cl.
| | | |
|---|---|---|
| *H01L 21/00* | (2006.01) | |
| *H10B 43/40* | (2023.01) | |
| *H01L 49/02* | (2006.01) | |
| *H01L 29/08* | (2006.01) | |
| *H10B 43/10* | (2023.01) | |
| *H10B 43/27* | (2023.01) | |

(52) U.S. Cl.
CPC .............. *H10B 43/40* (2023.02); *H01L 28/60* (2013.01); *H01L 29/0847* (2013.01); *H10B 43/10* (2023.02); *H10B 43/27* (2023.02)

(58) Field of Classification Search
CPC ............. H01L 21/76254; H01L 21/823; H01L 21/11578; H01L 21/31144; H01L 27/11573; H01L 27/11565; H01L 27/11582; H01L 28/60; H01L 28/91; H01L 28/20; H01L 29/0847; H01L 29/167; H01L 29/40117; H01L 29/792; H10B 43/40; H10B 43/10; H10B 43/27; H10B 43/50

See application file for complete search history.

(56) References Cited

U.S. PATENT DOCUMENTS

| | | | |
|---|---|---|---|
| 6,507,063 B2 | 1/2003 | Coolbaugh et al. | |
| 9,620,512 B1 | 4/2017 | Nishikawa et al. | |
| 9,659,954 B2 | 5/2017 | Kim et al. | |
| 10,438,964 B2 * | 10/2019 | Makala | H01L 21/31122 |
| 10,559,588 B2 | 2/2020 | Dong et al. | |
| 10,937,797 B2 * | 3/2021 | Seo | H01L 27/11565 |

(Continued)

FOREIGN PATENT DOCUMENTS

| | | |
|---|---|---|
| CN | 105304633 A | 2/2016 |
| CN | 106169476 A | 11/2016 |

(Continued)

*Primary Examiner* — Nikolay K Yushin
(74) *Attorney, Agent, or Firm* — William Park & Associates Ltd.

(57) ABSTRACT

A semiconductor memory device, with which a manufacturing method is associated, includes a substrate. The semiconductor memory device also includes a source structure disposed on a first region of the substrate, memory cell strings connected to the source structure, and a capacitor structure disposed on a second region of the substrate. The capacitor structure is spaced apart from the source structure in a horizontal direction.

8 Claims, 15 Drawing Sheets

(56) References Cited

U.S. PATENT DOCUMENTS

| | | |
|---|---|---|
| 2003/0087499 A1 | 5/2003 | Lane et al. |
| 2014/0284674 A1 | 9/2014 | Iwai |
| 2015/0078086 A1 | 3/2015 | Lee |
| 2015/0318296 A1 | 11/2015 | Kim et al. |
| 2017/0062461 A1 | 3/2017 | Takamatsu |
| 2018/0374866 A1* | 12/2018 | Makala ............ H01L 27/11575 |
| 2019/0221575 A1 | 7/2019 | Dong et al. |
| 2019/0304991 A1* | 10/2019 | Seo .................. H01L 27/11565 |

FOREIGN PATENT DOCUMENTS

| | | |
|---|---|---|
| CN | 106469729 A | 3/2017 |
| CN | 106558591 A | 4/2017 |
| CN | 106601752 A | 4/2017 |
| CN | 107431063 A | 12/2017 |
| CN | 108122921 A | 6/2018 |
| KR | 1020180061475 A | 6/2018 |

* cited by examiner

METHOD OF MANUFACTURING A SEMICONDUCTOR MEMORY DEVICE

CROSS-REFERENCE TO RELATED APPLICATION

The present application is a continuation application of U.S. patent Ser. No. 16/653,618, filed on Oct. 15, 2019, and claims priority under 35 U.S.C. § 119(a) to Korean patent application number 10-2019-0034681, filed on Mar. 26, 2019, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

In order to achieve a high degree of integration for semiconductor memory devices, a three-dimensional semiconductor memory device including three-dimensionally arranged memory cells has been proposed. The three-dimensional semiconductor memory device has been variously developed so as to increase a density of memory cells arranged in a limited area and to decrease chip size. However, such reductions in form factor may result in insufficient capacitance for optimal performance.

SUMMARY

In accordance with an aspect of the present disclosure, a semiconductor memory device includes a substrate. The semiconductor memory device also includes a source structure disposed on a first region of the substrate, memory cell strings connected to the source structure, and a capacitor structure disposed on a second region of the substrate. The capacitor structure is spaced apart from the source structure in a horizontal direction.

In accordance with another aspect of the present disclosure, a semiconductor memory device includes a substrate and interlayer insulating layers stacked on the substrate, wherein the interlayer insulating layers are spaced apart from each other. The semiconductor memory device also includes sacrificial insulating layers disposed between the interlayer insulating layers over a second region of the substrate. The semiconductor memory device further includes a capacitor structure disposed between the substrate and a dummy stack structure, wherein the dummy stack structure includes the interlayer insulating layers and the sacrificial insulating layers.

In accordance with still another aspect of the present disclosure, a method of manufacturing a semiconductor memory device includes forming a first stack structure by sequentially stacking a first doped semiconductor layer, a sacrificial layer, and a second doped semiconductor layer on a substrate. The method also includes forming a separation layer that separates the first stack structure into a preliminary source structure on a first region of the substrate and a capacitor structure on a second region of the substrate. The method further includes forming a trench that exposes the sacrificial layer of the preliminary source structure in the first region and replacing the sacrificial layer of the preliminary source structure with a contact source layer through the trench.

BRIEF DESCRIPTION OF THE DRAWINGS

Example embodiments are described hereinafter with reference to the accompanying drawings. However, the example embodiments may be embodied in different forms and should not be construed as limiting the present teachings. A limited number of possible embodiments are presented so that this disclosure will be enabling for those skilled in the art.

In the drawing figures, dimensions may be exaggerated for clarity of illustration. Like reference numerals refer to like elements throughout the drawings.

DETAILED DESCRIPTION

Figure 1:
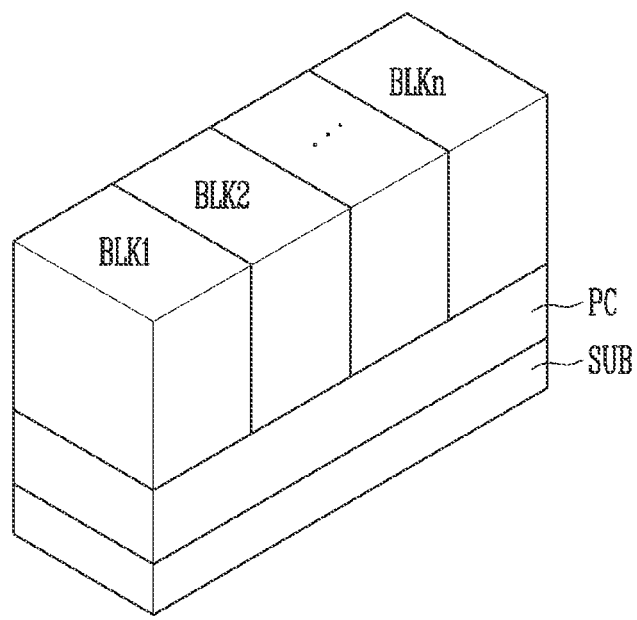
FIG. 1 is a block diagram schematically illustrating a semiconductor memory device in accordance with an embodiment of the present disclosure.

The specific structural or functional description disclosed herein is merely illustrative for the purpose of describing embodiments according to the concept of the present disclosure. The embodiments according to the concept of the present disclosure can be implemented in various forms thus, the present teachings should not be construed as being limited to the embodiments set forth herein.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Embodiments provide a semiconductor memory device including a capacitor and a manufacturing method thereof.

FIG. 1 is a block diagram schematically illustrating a semiconductor memory device in accordance with an embodiment of the present disclosure.

Referring to FIG. 1, the semiconductor memory device may include a peripheral circuit structure PC and memory blocks BLK1 to BLKn, which are disposed on a substrate SUB, The memory blocks BLK1 to BLKn may overlap with the peripheral circuit structure PC.

The substrate SUB may be a single crystalline semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed through a selective epitaxial growth process.

The peripheral circuit structure PC may include a row decoder; a column decoder, a page buffer, a control circuit, and the like, which constitute a circuit for controlling an operation of the memory blocks BLK1 to BLKn. For example, the peripheral circuit structure PC may include an NMOS transistor, a PMOS transistor, a resistor, and a first capacitor structure, which are electrically connected to the memory blocks BLK1 to BLKn. The peripheral circuit structure PC may be disposed between the substrate SUB and the memory blocks BLK1 to BLKn.

Each of the memory blocks BLK1 to BLKn may include a first region and a second region.

The first region of each of the memory blocks BLK1 to BLKn may include a source structure, bit lines, memory cell strings electrically connected to the source structure and the bit lines, word lines electrically connected to the memory cell strings, and select lines electrically connected to the memory cell strings. Each of the memory cell strings may include memory cells and select transistors, which are connected in series by a channel layer. Each of the select lines is used as a gate electrode of a select transistor corresponding thereto, and each of the word lines is used as a gate electrode of a memory cell corresponding thereto.

The second region of each of the memory blocks BLK1 to BLKn may include a second capacitor structure. The second region of each of the memory blocks BLK1 to BLKn may further include peripheral contact plugs that are connected to the peripheral circuit structure PC and extend in parallel to the channel layer.

The first capacitor structure and the second capacitor structure may be used for an operation of the memory cell strings. For example, each of the first capacitor structure and the second capacitor structure may be used as at least one of a capacitor for maintaining a constant power voltage and a capacitor for generating a voltage having a level higher than that of the power voltage.

Figure 2:
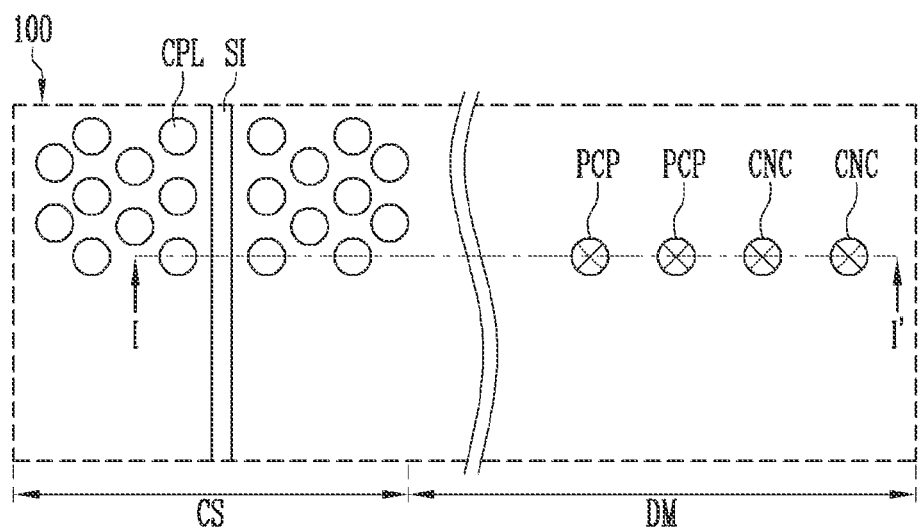
FIG. 2 is a plan view illustrating a portion of a semiconductor memory device in accordance with an embodiment of the present disclosure.

FIG. 2 is a plan view illustrating a semiconductor memory device 100 in accordance with an embodiment of the present disclosure. The semiconductor memory device 100 may represent a portion of the semiconductor memory device shown in FIG. 1. For example, the structure shown in FIG. 2 may constitute a portion of each of the memory blocks BLK1 to BLKn shown in FIG. 1.

Referring to FIG. 2, the semiconductor memory device 100 may include a cell stack structure CS and a dummy stack structure DM. The cell stack structure CS may be penetrated by a slit SI and cell plugs CPL. The dummy stack structure DM may be connected to the cell stack structure CS in a horizontal direction, and may be penetrated by peripheral contact plugs PCP and capacitor node contacts CNC.

Each of the cell plugs CPL constitutes a memory cell string corresponding thereto. The cell plugs CPL may penetrate the cell stack structure CS on both sides of the slit SI. The cell plugs CPL may be arranged in a matrix or zigzag fashion.

Although not shown in the drawing, the cell plugs CPL, the peripheral contact plugs PCP, and the capacitor node contacts CNC may be connected to metal lines disposed on the cell stack structure CS and the dummy stack structure DM. The metal lines connected to the capacitor node contacts CNC may constitute a third capacitor structure.

Figure 3:
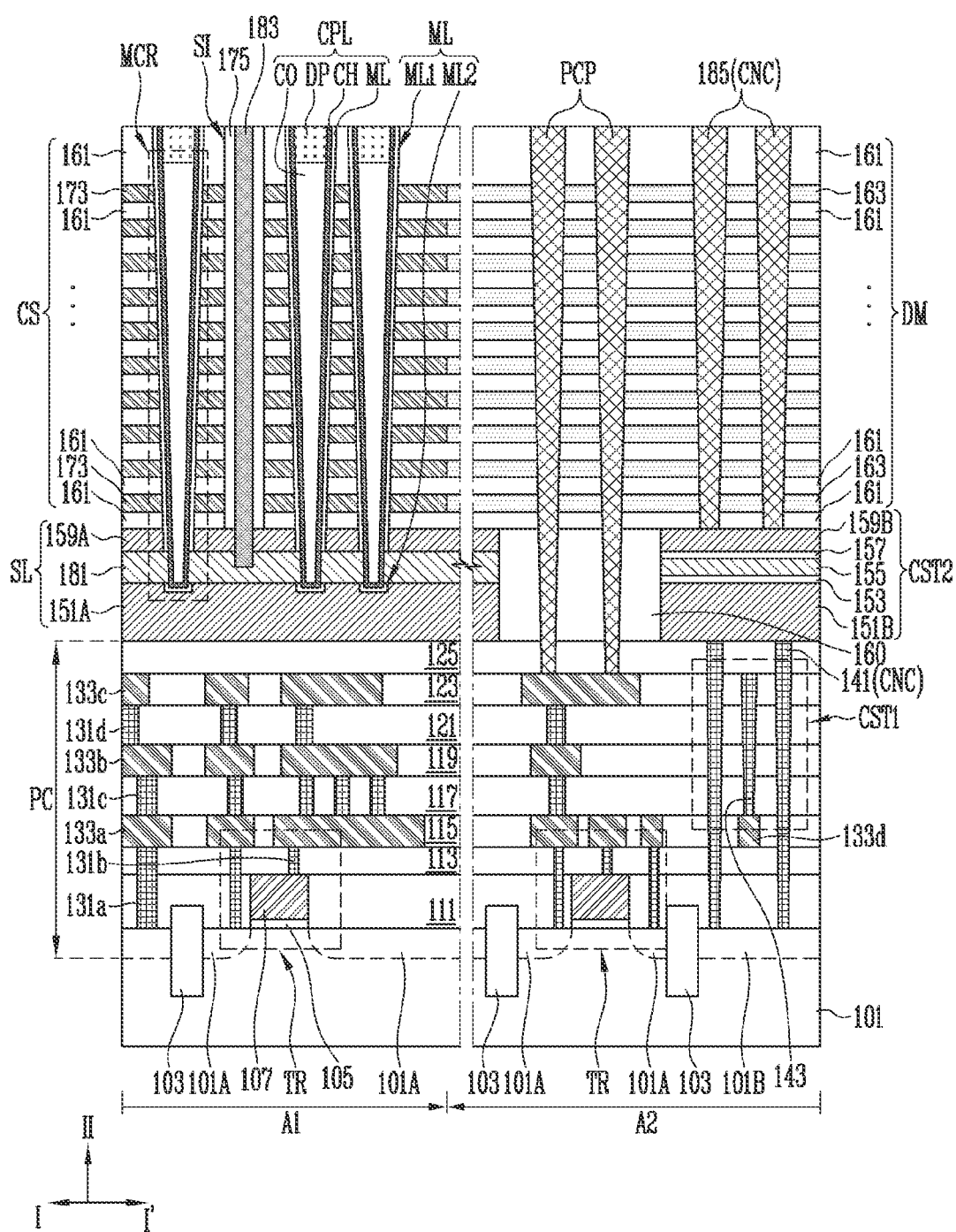
FIG. 3 illustrates a section of the semiconductor memory device taken along line I-I' shown in FIG. 2.

FIG. 3 illustrates a section of the semiconductor memory device 100 taken along line I-I" shown in FIG. 2.

Referring to FIG. 3, the cell stack structure CS and the dummy stack structure DM are disposed on a substrate 101 including a first region A1 and a second region A2. The second region A2 is defined as a region extending in a horizontal direction from the first region A1. Each of the cell stack structure CS and the dummy stack structure DM may include interlayer insulating layers 161 stacked in a vertical direction II intersecting the horizontal direction while being spaced apart from each other. Each of the interlayer insulating layers 161 may extend to overlap with the first region A1 and the second region A2 of the substrate 101.

The dummy stack structure DM is disposed on the second region A2 of the substrate 101. The dummy stack structure DM may include sacrificial insulating layers 163 disposed between the interlayer insulating layers 161 on the second region A2. The sacrificial insulating layers 163 are formed of a material having an etching rate different from that of the interlayer insulating layers 161. For example, the interlayer insulating layers 161 may include silicon oxide, and the sacrificial insulating layers 163 may include silicon nitride.

The cell stack structure CS is disposed on the first region A1 of the substrate 101. The cell stack structure CS may include gate electrodes 173 disposed between the interlayer insulating layers 161 on the first region A1. The gate electrodes 173 may be disposed at the same levels as the sacrificial insulating layers 163. Each of the gate electrodes 173 may include various conductive materials such as a doped silicon layer, a metal layer, a metal silicide layer, and a barrier layer, and include two or more kinds of conductive materials. For example, each of the gate electrodes 173 may include tungsten and a titanium nitride layer (TiN) surrounding the surface of the tungsten. Tungsten is a low-resistance metal, and may decrease resistance of the gate electrodes 173. The titanium nitride layer (TiN) is a barrier layer, and may prevent direct contact between the tungsten and the interlayer insulating layers 161.

The cell stack structure CS and the dummy stack structure DM may overlap with a peripheral circuit structure PC. The peripheral circuit structure PC may include transistors TR, a resistor (not shown), and a first capacitor structure CST1. The transistors TR and the first capacitor structure CST1 may be separated from each other by an isolation layer 103.

The cell stack structure CS and the dummy stack structure DM may be disposed to be spaced apart from the peripheral circuit structure PC and the substrate 101.

In an embodiment of the present disclosure, a source structure SL may be disposed between the peripheral circuit structure PC and the cell stack structure CS, and a second capacitor structure CST2 may be disposed between the dummy stack structure DM and the peripheral circuit structure PC. The source structure SL is disposed on the first region A1 of the substrate 101, and the second capacitor structure CST2 is disposed on the second region A2 of the substrate 101 while being spaced apart from the source structure SL in the horizontal direction. In other words, the source structure SL and the second capacitor structure CST2 may be substantially disposed at the same level. The source structure SL and the second capacitor structure CST2 may face each other with a separation layer 160 interposed therebetween. For example, a sidewall of the source structure SL and a sidewall of the second capacitor structure CST2 may face each other with the separation layer 160 interposed therebetween. The separation layer 160 may be formed of an insulating layer. For example, the separation layer 160 may include an oxide layer.

The second capacitor structure CST2 may be connected to the capacitor node contacts CNC. The capacitor node contacts CNC may be formed of a conductive material. The capacitor node contacts CNC may include one or more first capacitor node contacts 141 and one or more second capacitor node contacts 185.

The first capacitor node contacts 141 extend to be in contact with any one of the regions of the substrate 101, which are divided by the isolation layers 103. The isolation layers 103 may be disposed in a well region (not shown) of the substrate 101, which is doped with an n-type or p-type impurity. The isolation layers 103 may be formed of an insulating material.

The regions divided by the isolation layers 103 may be used as various regions for driving the semiconductor memory device. For example, some of the regions divided by the isolation layers 103 may be used as junctions 101A of the transistors TR, and the other of the regions divided by the isolation layers 103 may be used as a capacitor contact region 101B. The first capacitor node contacts 141 may be in contact with the capacitor contact region 101B.

The first capacitor structure CST1 may include the first capacitor node contacts 141 and an auxiliary capacitor electrode 143. The first capacitor node contacts 141 may extend from the capacitor contact region 101B of the substrate 101 to be connected to the second capacitor structure CST2. The auxiliary capacitor electrode 143 is formed of a conductive material, and is spaced apart from the second capacitor structure CST2 and the substrate 101.

The transistors TR may include at least one of an NMOS transistor and a PMOS transistor. Each of the transistors TR may include a gate insulating layer 105, a peri gate 107, and the junctions 101A. The gate insulating layer 105 may be formed on the substrate 101 between the isolation layers 103. The peri gate 107 is a gate electrode controlling the on/off function of a transistor TR corresponding thereto. The junctions 101A are disposed at both sides of the peri gate 107. One of the junctions 101A disposed at both the sides of the peri gate 107 may be used as a source junction, and the other of the junctions 101A may be used as a drain junction.

The transistors TR and the first capacitor structure CST1 may be formed in a lower insulating layer including a plurality of insulating layers 111, 113, 115, 117, 119, 121, 123, and 125. The auxiliary capacitor electrode 143 and the transistors TR may be connected to at least one of lower contact plugs 131a to 131d and lower lines 133a to 133d. The lower contact plugs 131a to 131d and the lower lines 133a to 133d may penetrate at least one of the plurality of insulating layers 111, 113, 115, 117, 119, 121, 123, and 125.

The source structure SL, the separation layer 160, and the second capacitor structure CST2 are disposed on the plurality of insulating layers 111, 113, 115, 117, 119, 121, 123, and 125 constituting the lower insulating layer.

The source structure SL may include a first source layer 151A, a contact source layer 181, and a second source layer 159A. The first source layer 151A is disposed between the peripheral circuit structure PC and the cell stack structure CS. The second source layer 159A is disposed between the first source layer 151A and the cell stack structure CS. The contact source layer 181 is disposed between the first source layer 151A and the second source layer 159A. Each of the first source layer 151A, the contact source layer 181, and the second source layer 159A may include a doped semiconductor layer. The doped semiconductor layer may include a source dopant. For example, the source dopant may be an n-type impurity. For example, each of the first source layer 151A, the contact source layer 181, and the second source layer 159A may include an n-type doped silicon layer.

The second capacitor structure CST2 may include a first conductive pattern 151B, a sacrificial layer 155, and a second conductive pattern 159B. The first conductive pattern 151B is spaced apart from in the horizontal direction from the first source layer 151A by the separation layer 160, and has a sidewall facing the first source layer 151A. The first conductive pattern 151B may be substantially disposed at the same level as the first source layer 151A, and include the same material as the first source layer 151A. For example, the first conductive pattern 151B may be formed of a doped semiconductor layer including a source dopant. The second conductive pattern 159B is spaced apart in the horizontal direction from the second source layer 159A by the separation layer 160, and has a sidewall facing the second source layer 159A. The second conductive pattern 159B may be substantially disposed at the same level as the second source layer 159A, and include the same material as the second source layer 159A. For example, the second conductive pattern 159B may be formed of a doped semiconductor layer including a source dopant. The sacrificial layer 155 may be disposed between the first conductive pattern 151B and the second conductive pattern 159B. The sacrificial layer 155 may include an insulating material or semiconductor material having an etching rate different from those of the first source layer 151A, the second source layer 159A, the first conductive pattern 151B, and the second conductive pattern 159B. For example, the sacrificial layer 155 may include silicon. For example, the sacrificial layer 155 may include undoped silicon.

The second capacitor structure CST2 may further include a first insulating layer 153 disposed between the first conductive pattern 151B and the sacrificial layer 155 and a second insulating layer 157 disposed between the second conductive pattern 159B and the sacrificial layer 155. Each of the first insulating layer 153 and the second insulating layer 157 may include an oxide layer.

The cell plugs CPL may penetrate the cell stack structure CS and extend to the inside of the source structure SL. The cell plug CPL may include a channel layer CH, a memory layer ML, a core insulating layer CO, and a doped pattern DP. The memory layer ML may be formed to surround the channel layer CH, and the core insulating layer CO and the doped pattern DP may be surrounded by the channel layer CH.

The channel layer CH may be formed of a semiconductor layer. For example, the channel layer CH may be formed of a silicon layer. The doped pattern DP may be disposed on the core insulating layer CO. The channel layer CH may extend along outer walls of the core insulating layer CO and the doped pattern DP. The doped pattern DP may be in contact with the channel layer CH. The doped pattern DP may be formed of a doped semiconductor layer. For example, the doped pattern DP may be formed of an n-type doped silicon layer. The channel layer CH may be used as a channel region of a memory cell string MCR, and the doped pattern DP may be used as a drain junction of the memory cell string MCR. The memory layer ML may be penetrated by the contact source layer 181 to be separated into a first memory pattern ML1 and a second memory pattern ML2. The first memory pattern ML1 may be disposed between the cell stack structure CS and the channel layer CH, and the second memory pattern ML2 may be disposed between the first source layer 151A of the source structure and the channel layer CH. The contact source layer 181 of the source structure SL extends to be in contact with a sidewall of the channel layer CH between the first memory pattern ML1 and the second memory pattern ML2.

The slit SI may be filled with a spacer insulating layer 175 and a source contact structure 183.

The spacer insulating layer 175 may be formed on a sideman of the slit SI to cover a sidewall of the cell stack structure CS. The spacer insulating layer 175 may insulate the source contact structure 183 from the cell stack structure CS.

The source contact structure 183 may extend in parallel to the cell plugs CPL to be connected to the source structure SL. The source contact structure 183 may be formed of a conductive material. The source contact structure 183 may include various conductive materials such as a doped silicon layer, a metal layer, a metal silicide layer, and a barrier layer, and may include two or more kinds of conductive materials. For example, the source contact structure 183 may be formed in a stacking structure of a doped silicon layer in contact with the source structure SL and a metal layer formed on the doped silicon layer. The doped silicon layer may include an n-type dopant, and the metal layer may include a low-resistance metal such as tungsten so as to decrease resistance thereof. The source contact structure 183 may extend from the contact source layer 181. The second source layer 159A may be penetrated by the source contact structure 183.

The gate electrodes 173 may be used as source select lines, word lines, and drain select lines of the memory cell string MCR. For example, a lowermost gate electrode disposed close to the source structure SL among the gate electrodes 173 may be used as a source select line. An uppermost gate electrode disposed most distant from the source structure SL among the gate electrodes 173 may be used as a drain select line. However, other embodiments of the present disclosure are not so limited. For example, the lowermost gate electrode and one or more gate electrodes stacked over the lowermost gate electrode in the vertical direction II may be used as the source select lines. For example, the uppermost gate electrode and one or more gate electrodes disposed under the uppermost gate electrode may be used as the drain select lines. Intermediate electrodes disposed between the source select line(s) and the drain select line(s) may be used as the word lines.

The memory cell string MCR may include at least one source select transistor, memory cells, and at least one drain select transistor. The source select transistor is defined at an intersection portion of the gate electrode used as the source select line and the channel layer CH. The drain select transistor is defined at an intersection portion of the gate electrode used as the drain select line and the channel layer CH. The memory cells are defined at intersection portions of the gate electrodes used as the word lines and the channel layer CH. The source select transistor, the memory cells, and the drain select transistor, which are included in the memory cell string MCR, may be connected in series by the channel layer CH. The channel layer CH of the memory cell string MCR is connected to the source structure SL.

Each of the peripheral contact plugs PCP may be formed of a conductive material, and be electrically connected to any one of the transistors TR, which corresponds thereto. To this end, the peripheral contact plugs PCP may penetrate the dummy stack structure DM and the separation layer 160, and penetrate at least one of the plurality of insulating layers 111, 113, 115, 117, 119, 121, 123, and 125 constituting the lower insulating layer.

The second capacitor node contacts 185 among the capacitor node contacts CNC may penetrate the dummy stack structure DM to be in contact with the second capacitor structure CST2.

The first capacitor node contacts 141 extend toward the substrate 101 from the first conductive pattern 151B of the second capacitor structure CST2. The second capacitor node contacts 185 may extend in parallel to the cell plugs CPL from the second conductive pattern 159B of the second capacitor structure CST2.

The arrangement structure and number of the first capacitor node contacts 141 and the second capacitor node contacts 185 may be variously modified. Various modifications are described below with reference to FIGS. 5A to 5F.

Figure 4A:
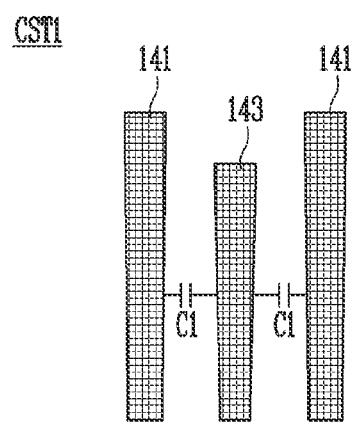
FIGS. 4A to 4C are schematic views illustrating first and second capacitor structures shown in FIG. 3.
Figure 4B:
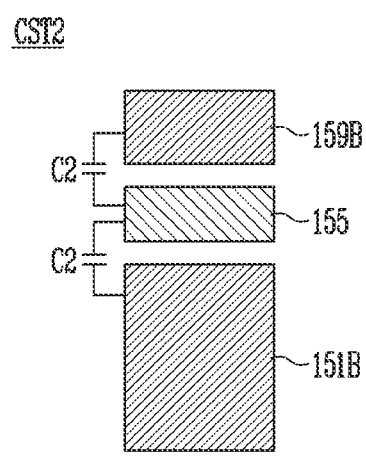
Figure 4C:
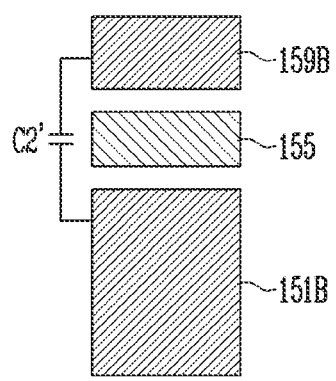

FIGS. 4A to 4C are schematic views illustrating the first and second capacitor structures CST1 and CST2 shown in FIG. 3. FIG. 4A illustrates the first capacitor structure CST1, and each of FIGS. 4B and 4C illustrates the second capacitor structure CST2.

Referring to FIG. 4A, the first capacitor structure CST1 may include a vertical capacitor C1 defined between the first capacitor node contact 141 and the auxiliary capacitor electrode 143, which are adjacent to each other.

In an embodiment, the auxiliary capacitor electrode 143 may be omitted. In the embodiment, the first capacitor node contact 141 connected to the second capacitor structure CST2 shown in FIG. 3 does not define the vertical capacitor C1, but may be used as a contact pattern.

Referring to FIG. 4B, the second capacitor structure CST2 may include horizontal capacitors C2 connected in parallel. For example, when the sacrificial layer 155 is formed of silicon, the horizontal capacitors C2 may be defined between the sacrificial layer 155 and the first conductive pattern 151B and between the sacrificial layer 155 and the second conductive pattern 159B.

Referring to FIG. 4C, the second capacitor structure CST2 may include a horizontal capacitor C2'. For example, when the sacrificial layer 155 is formed of an insulating material, the horizontal capacitor C2' may be defined between the first conductive pattern 151B and the second conductive pattern 159B.

FIGS. 5A to 5F are sectional views schematically illustrating capacitor structures and capacitor node contacts in accordance with various embodiments of the present disclosure. FIGS. 5A to 5F illustrate various modifications of the second capacitor structure CST2 shown in FIG. 3 and the first capacitor node contact and the second capacitor node contact, which are connected thereto.

Referring to FIGS. 5A to 5F, the second capacitor structure CST2 shown in FIG. 3 may be connected to any one of first capacitor node contacts 141a to 141f and any one of second capacitor node contacts 185a to 185f.

Figure 5A:
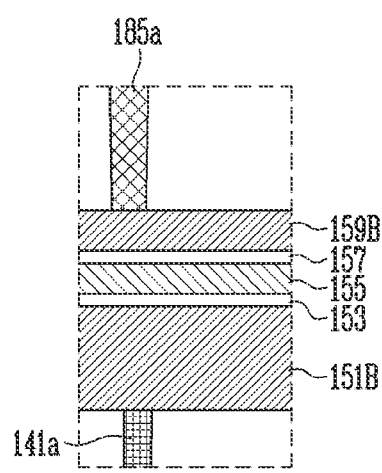
FIGS. 5A to 5F are sectional views schematically illustrating capacitor structures and capacitor node contacts in accordance with various embodiments of the present disclosure.
Figure 5B:
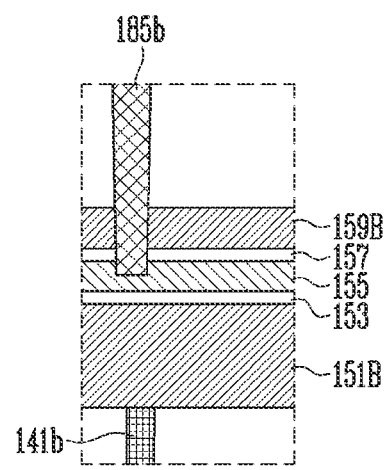
Figure 5C:
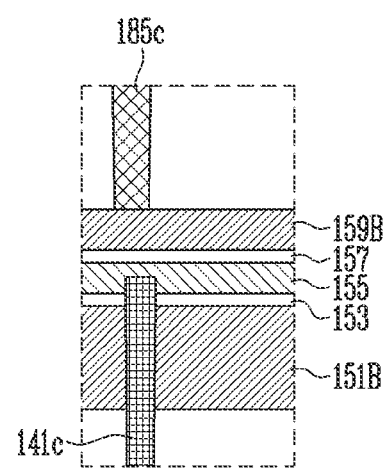
Figure 5D:
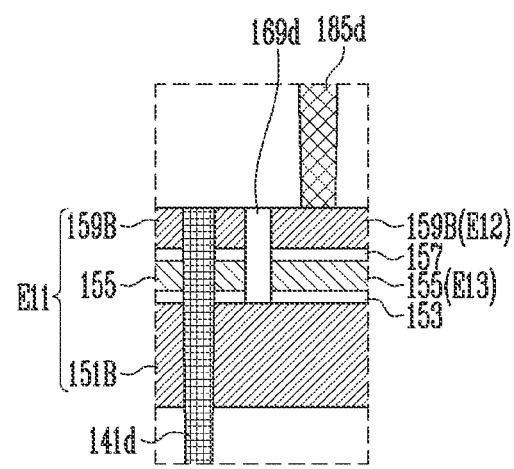
Figure 5E:
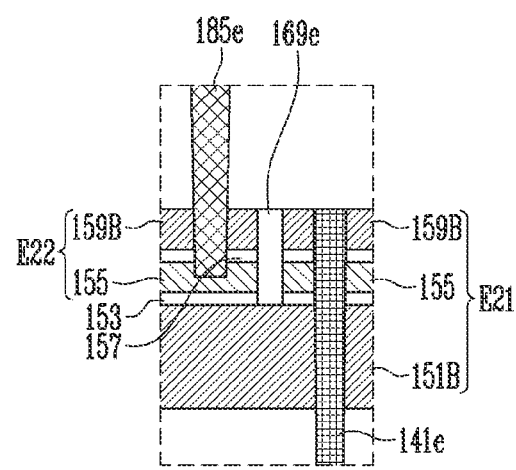
Figure 5F:
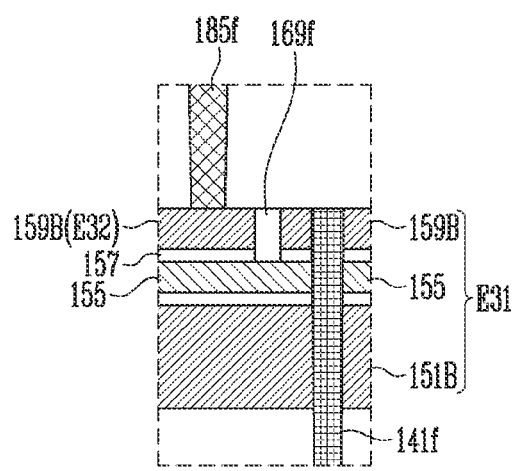

In an embodiment, as shown in FIGS. 5A and 5B, the first capacitor node contacts 141a and 141b may be in contact with the first conductive pattern 151B of the second capacitor structure. In another embodiment, as shown in FIG. 5C, the first capacitor node contact 141c may penetrate the first conductive pattern 151B and the first insulating layer 153 of the second capacitor structure and extend to the inside of the sacrificial layer 155. In still another embodiment, as shown in FIGS. 5D, 5E, and 5F, the first capacitor node contacts 141d, 141e, and 141f may penetrate the first conductive pattern 151B, the first insulating layer 153, the sacrificial layer 155, and the second conductive pattern 159B of the second capacitor structure.

In an embodiment, as shown in FIGS. 5A, 5C, 5D, and 5F, the second capacitor node contacts 185a, 185c, 185d, and 185f may be in contact with the second conductive pattern 159B of the second capacitor structure. In another embodiment, as shown in FIGS. 5B and 5E, the second capacitor node contacts 185b and 185e may penetrate the second contact pattern 159B and the second insulating layer 157 and extend to the inside of the sacrificial layer 155.

Referring to FIG. 5A, the sacrificial layer 155 may be formed of silicon. Horizontal capacitors may be defined between the sacrificial layer 155 and the first conductive pattern 151B and between the sacrificial layer 155 and the second conductive pattern 159B.

Referring to FIG. 5B, the sacrificial layer 155 may be formed of silicon. A horizontal capacitor may be defined between the sacrificial layer 155 and the first conductive pattern 151B.

Referring to FIG. 5C, the sacrificial layer 155 may be formed of silicon. A horizontal capacitor may be defined between the sacrificial layer 155 and the second conductive pattern 159B.

Referring to FIGS. 5D, 5E, and 5F, conductive material layers disposed at the same level may be respectively in contact with one of the first capacitor node contacts 141d, 141e, and 141f and one of the second capacitor node contacts 185d, 185e, and 185f. The conductive material layers disposed at the same level may be separated from each other by capacitor insulating layers 169d, 169e, and 169f disposed between the first capacitor node contacts 141d, 141e, and 141f and the second capacitor node contacts 185d, 185e, and 185f.

Referring to FIG. 5D, the first conductive pattern 151B, a portion of the sacrificial layer 155, and a portion of the second conductive pattern 159B, which are connected to the first capacitor node contact 141d, may be used as a first capacitor electrode E11. A portion of the second conductive pattern 159B, which is connected to the second capacitor node contact 185d, may be used as a second capacitor electrode E12. The sacrificial layer 155 may be formed of silicon. A portion of the sacrificial layer 155, which overlaps with the second capacitor electrode E12, may be used as a third capacitor electrode E13.

The capacitor insulating layer 169d penetrates the second conductive pattern 159B such that the second conductive pattern 159B is separated into a pattern for the first capacitor electrode E11 and a pattern for the second capacitor electrode E12. The capacitor insulating layer 169d penetrates the sacrificial layer 155 such that the sacrificial layer 155 is separated into a pattern for the first capacitor electrode E11 and a pattern for the third capacitor electrode E13.

According to the above-described structure, horizontal capacitors may be defined between the first capacitor electrode E11 and the third capacitor electrode E13 and between the second capacitor electrode E12 and the third capacitor electrode E13.

Referring to FIG. 5E, the first conductive pattern 151B, a portion of the sacrificial layer 155, and a portion of the second conductive pattern 159B, which are connected to the first capacitor node contact 141e, may be used as a first capacitor electrode E21. A portion of the second conductive pattern 159B and a portion of the sacrificial layer 155, which are connected to the second capacitor node contact 185e, may be used as a second capacitor electrode E22.

The capacitor insulating layer 169e penetrates the second conductive pattern 159B such that the second conductive pattern 159B is separated into a pattern for the first capacitor electrode E21 and a pattern for the second capacitor electrode E22. The capacitor insulating layer 169e penetrates the sacrificial layer 155 such that the sacrificial layer 155 is separated into a pattern for the first capacitor electrode E21 and a pattern for the second capacitor electrode E22.

According to the above-described structure, a capacitor may be defined between the first capacitor electrode E21 and the second capacitor electrode E22.

Referring to FIG. 5F, the first conductive pattern 151B, the sacrificial layer 155, and a portion of the second conductive pattern 159B, which are connected to the first capacitor node contact 141f, may be used as a first capacitor electrode E31. A portion of the second conductive pattern 159B, which is connected to the second capacitor node contact 185f, may be used as a second capacitor electrode E32.

The capacitor insulating layer 169f penetrates the second conductive pattern 159B such that the second conductive pattern 159B is separated into a pattern for the first capacitor electrode E31 and a pattern for the second capacitor electrode E32.

According to the above-described structure, a capacitor may be defined between the first capacitor electrode E31 and the second capacitor electrode E32.

Figure 6:
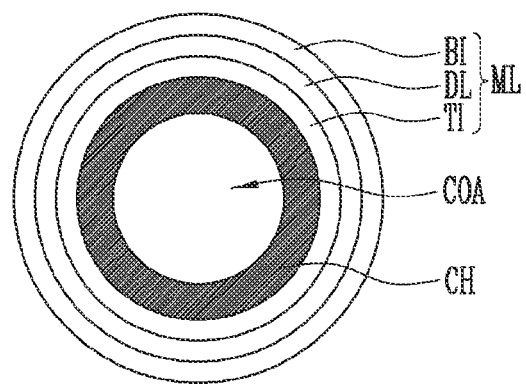
FIG. 6 is an enlarged view illustrating a cross-section of a cell plug shown in FIG. 2.

FIG. 6 is an enlarged view illustrating a cross-section of the cell plug CPL shown in FIG. 2.

Referring to FIG. 6, the channel layer CH of the cell plug CPL may be formed in a ring shape defining a core region COA. The core region COA may be filled with the core insulating layer CO or the doped pattern DP, which are described with reference to FIG. 3. The memory layer ML of the cell plug CPL may include a tunnel insulating layer TI, a data storage layer DL, and a blocking insulating layer BI, which are sequentially stacked on a surface of the channel layer CH.

The data storage layer DL may be formed of a material layer capable of storing data changed using Fowler-Nordheim tunneling. To this end, the data storage layer DA may be formed of various materials. For example, the data storage layer DA may be formed of a nitride layer in which charges can be trapped. However, the present disclosure is not limited thereto, and the data storage layer DL may include silicon, a phase change material, nano dots, and the like. The blocking insulating layer BI may include an oxide layer capable of blocking charges. The tunnel insulating layer TI may be formed of a silicon oxide layer through which charges can tunnel.

FIGS. 7A to 7H are sectional views illustrating a manufacturing method of the semiconductor memory device 100 in accordance with an embodiment of the present disclosure.

Figure 7A:
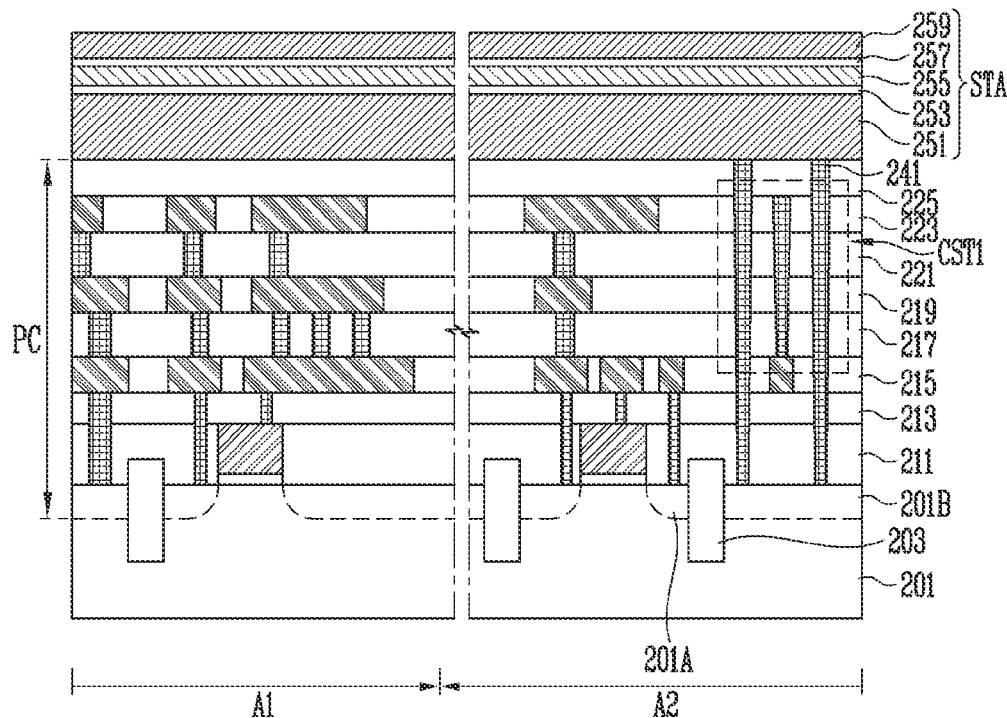
FIGS. 7A to 7H are sectional views illustrating a manufacturing method of the semiconductor memory device in accordance with an embodiment of the present disclosure.

Referring to FIG. 7A, the peripheral circuit structure PC described with reference to FIG. 3 may be formed on a substrate 201 including a first region A1 and a second region A2. Hereinafter, repeated descriptions of the peripheral circuit structure PC are omitted. The peripheral circuit structure PC may be formed in a plurality of insulating layers 211, 213, 215, 217, 219, 221, 223, and 225 constituting a lower insulating layer.

The peripheral circuit structure PC may include a first capacitor structure CST1 including a first capacitor node contact 241. The first capacitor node contact 241 may penetrate the plurality of insulating layers 211, 213, 215, 217, 219, 221, 223, and 225 constituting the lower insulating layer to be connected to a capacitor contact region 201B formed by injecting an impurity into the second region A1 of the substrate 201.

The capacitor contact region 201B may be separated from junctions 201A by an isolation layer 203 formed in the substrate 201.

Subsequently, a first stack structure STA may be formed on the plurality of insulating layers 211, 213, 215, 217, 219, 221, 223, and 225 including the peripheral circuit structure PC. The first stack structure STA extends to overlap with the first region A1 and the second region A2 of the substrate 201.

The process of forming the first stack structure STA may include a process of forming a first insulating layer 253 on a first doped semiconductor layer 251, a process of forming a sacrificial layer 255 on the first insulating layer 253, a process of forming a second insulating layer 257 on the sacrificial layer 255, and a process of forming a second doped semiconductor layer 259 on the second insulating layer 257.

The first doped semiconductor layer 251 and the second doped semiconductor layer 259 may include a doped silicon layer. The first doped semiconductor layer 251 and the second doped semiconductor layer 259 may include a source dopant. For example, the source dopant may be an n-type impurity.

The sacrificial layer 255 may be selected from an insulating material, a semiconductor material, and a conductive material, which have an etching rate different from that of the first doped semiconductor layer 251 and the second doped semiconductor layer 259. For example, the sacrificial layer 255 may include a silicon layer. The silicon layer may be an undoped silicon layer.

The first insulating layer 253 and the second insulating layer 257 may be used as a protective layer for preventing loss of the first doped semiconductor layer 251 and the second doped semiconductor layer 259 in a subsequent process of selectively removed the sacrificial layer 255. For example, each of the first insulating layer 253 and the second insulating layer 257 may include an oxide layer.

Figure 7B:
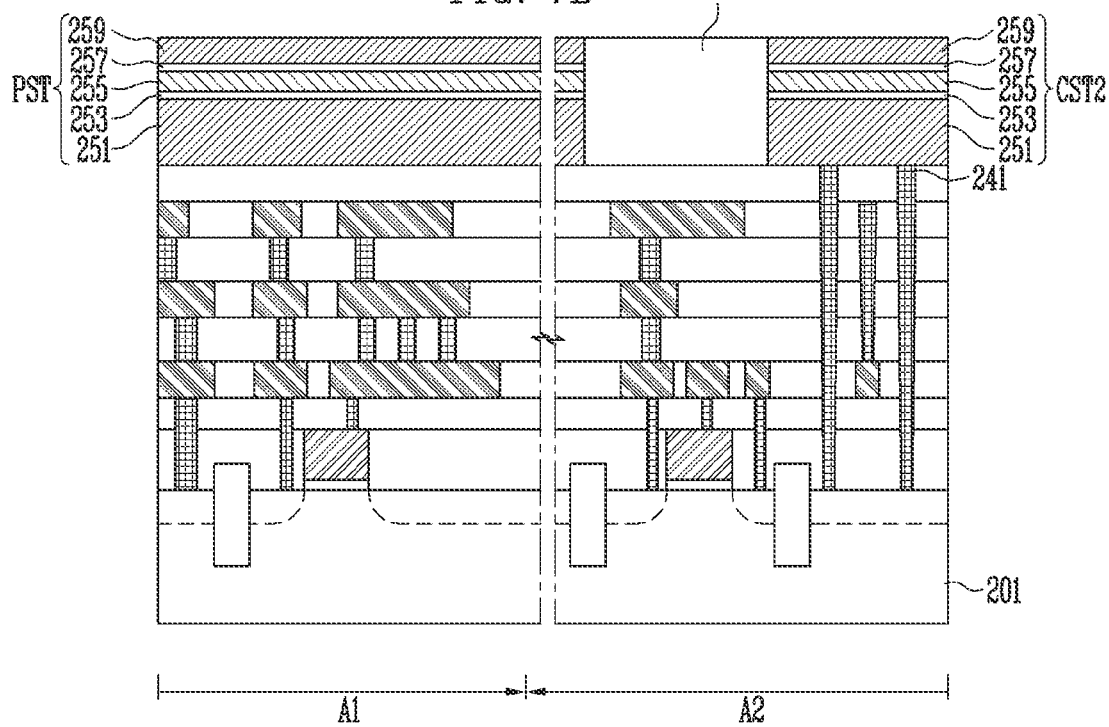

Referring to FIG. 7B, a separation layer 260 may be formed, which separates the first stack structure STA into a preliminary source structure PST and a second capacitor structure CST2. The separation layer 260 may penetrate the second doped semiconductor layer 259, the second insulating layer 257, the sacrificial layer 255, the first insulating layer 253, and the first doped semiconductor layer 251. The separation layer 260 may be formed of an insulating material.

The preliminary source structure PST overlaps with the first region A1 of the substrate 201 on the first region A1 of the substrate 201. The second capacitor structure CST overlaps with the second region A2 of the substrate 201 to be connected to the first capacitor node contact 241.

Figure 7C:
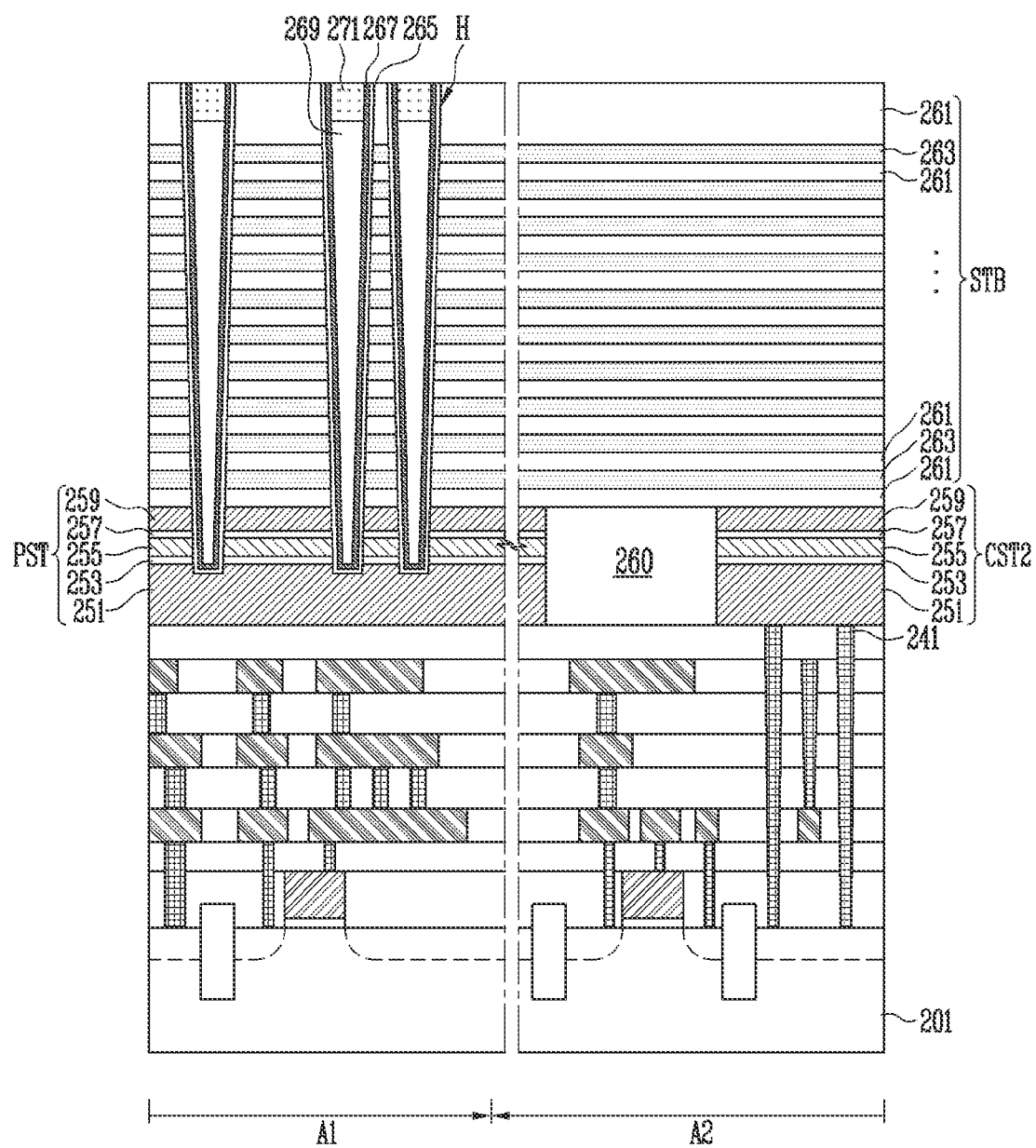

Referring to FIG. 7C, a second stack structure STB may be formed on the substrate 201 to overlap with the preliminary source structure PST, the separation layer 260, and the second capacitor structure CST2. The second stack structure STB may be formed by alternately stacking first material layers 261 and second material layers 263 on the second doped semiconductor layer 259. Each of the first material layers 261 and the second material layers 263 may extend in a horizontal direction to overlap with the preliminary source structure PST and the separation layer 260.

The first material layers 261 may constitute the interlayer insulating layers 161 described with reference to FIG. 3. The second material layers 263 are formed of a material having an etching rate different from that of the first material layer 261. For example, the first material layers 261 may include silicon oxide, and the second material layers 263 may include silicon nitride. The second material layers 263 may constitute the sacrificial insulating layers 163 described with reference to FIG. 3.

Subsequently, holes H penetrating the first material layers 261 and the second material layers 263 are formed. The holes H overlap with the first region A1 of the substrate 201. The holes H may penetrate the second doped semiconductor layer 259, the second insulating layer 257, the sacrificial layer 255, and the first insulating layer 253 of the preliminary source structure PST, and may extend to the inside of the first doped semiconductor layer 251.

Subsequently, a memory layer 265, a channel layer 267, a core insulating layer 269, and a doped pattern 271 may be formed in each of the holes H.

The memory layer 265 is formed on a surface of each of the holes H, and may be formed in a liner shape such that a central region of each of the holes H remains open. The memory layer 265 may include the blocking insulating layer BI, the data storage layer DL, and the tunnel insulating layer TI, which are described with reference to FIG. 6.

In an embodiment, the channel layer 267 is formed on a surface of the memory layer 265, and may be formed in a liner shape such that the central region of each of the holes H remains open. In another embodiment, the channel layer 267 may be formed to fill the central region of each of the holes H.

After the channel layer 267 is formed in a liner shape, the open central region of each of the holes H may be filled with the core insulating layer 269 and the doped pattern 271.

The channel layer 267 may include a silicon layer. The core insulating layer 269 may include oxide. The doped pattern 271 may include an n-type doped silicon layer.

The channel layers 267 formed in the holes H may extend to the inside of the first doped semiconductor layer 251 of the preliminary source structure PST.

Figure 7D:
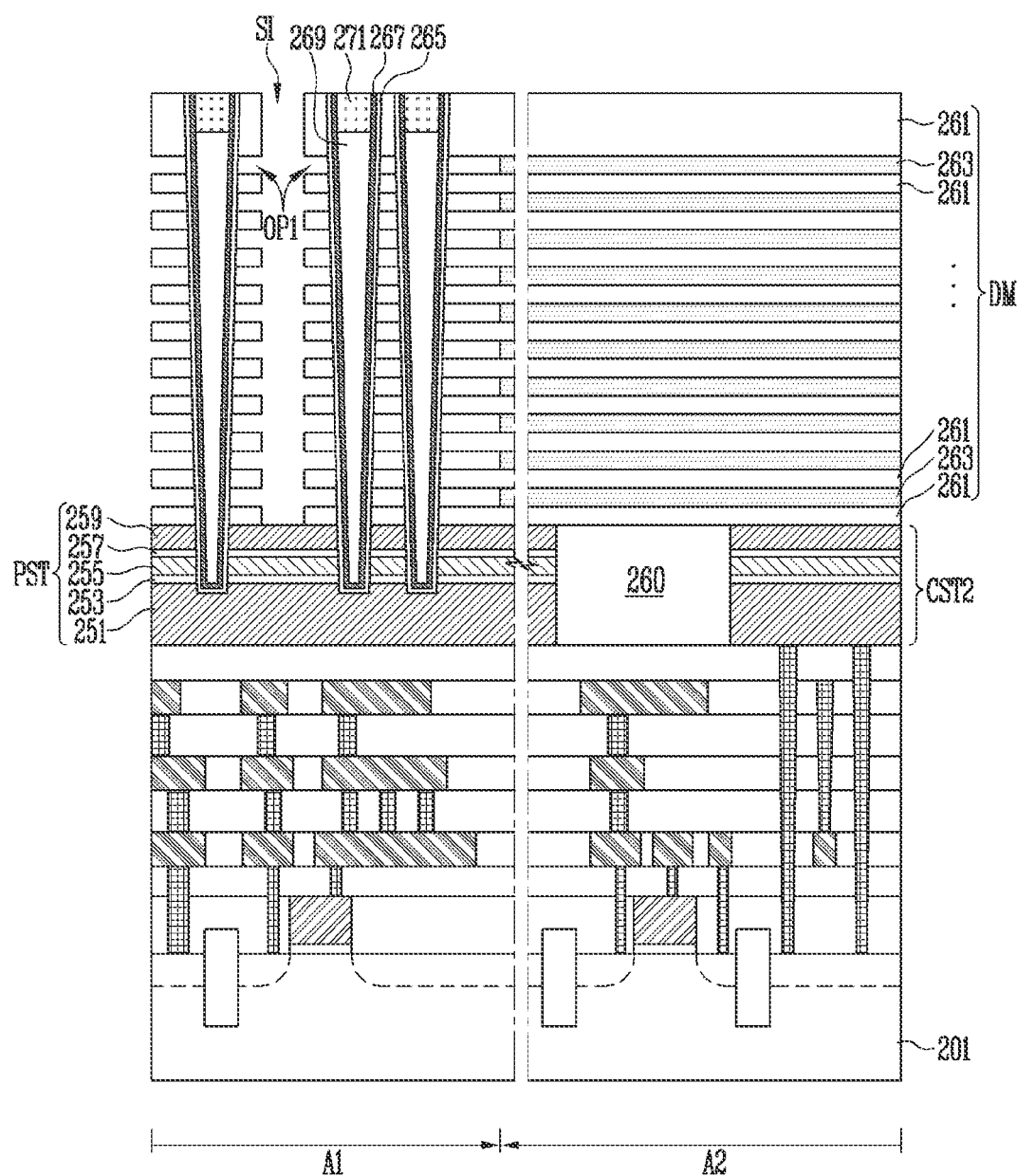

Referring to FIG. 7D, a slit SI may be formed, which penetrates the first material layers 261 and the second material layers 263 between the channel layers 267. In an etching process for forming the slit SI, the second doped semiconductor layer 259 having an etching resistance against an etchant for etching the first and second material layers 261 and 263 may serve as an etch stop layer. The slit SI may overlap with the preliminary source structure PST, and include a bottom surface exposing the second doped semiconductor layer 259 of the preliminary source structure PST.

Subsequently, a portion of each of the second material layers 263, which overlaps with the first region A1 of the substrate 201, is removed through the slit SI. Accordingly, first openings OP1 are defined between the first material layers 261 adjacent to each other in their stacking direction. The first openings OP1 overlap with the first region A1 of the substrate 201.

Another portion of each of the second material layers 263, which overlaps with the second region A2 of the substrate 201, is not removed but may remain. The first material layers 261 and the second material layers 263, which remain on the second region A2 of the substrate 201, may constitute a dummy stack structure DM. The dummy stack structure DM may overlap the separation layer 260 and the second capacitor structure CST2.

Figure 7E:
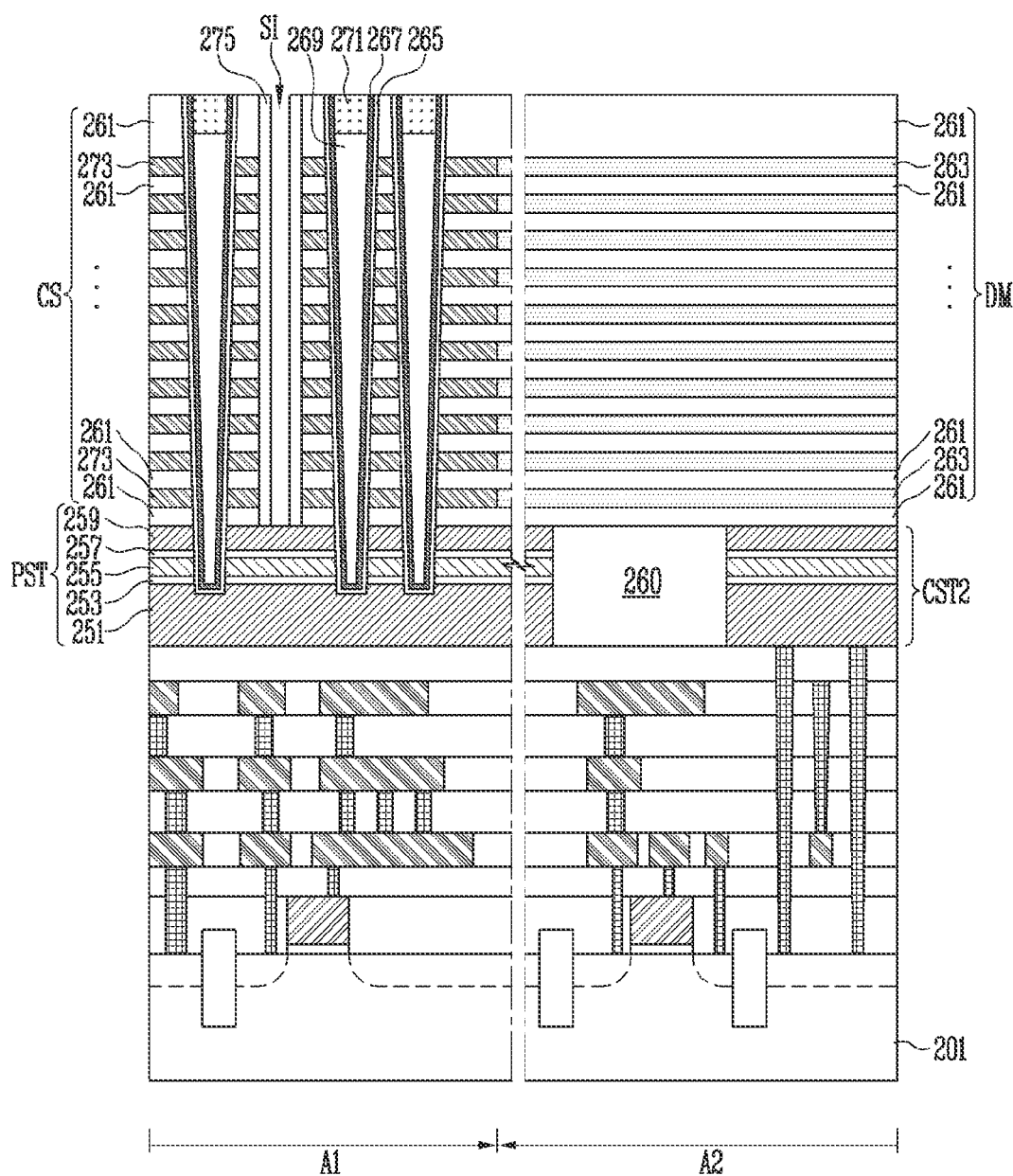

Referring to FIG. 7E, the first openings OP1 shown in FIG. 7D are filled with gate electrodes 273. Accordingly, a cell stack structure CS may be formed, which includes the first material layers 261 and the gate electrodes 273, which are alternately stacked on the first region A1 of the substrate 201. The cell stack structure CS may overlap with the preliminary source structure PST.

The process of forming the gate electrodes 273 may include a process of introducing a conductive material through the slit SI such that the first openings OP1 shown in FIG. 7D are filled with the conductive material and a process of removing a portion of the conductive material formed in the slit SI such that the conductive material is separated into the gate electrodes 273.

Each of the gate electrodes 273 may include at least one of a doped silicon layer, a metal silicide layer, and a metal layer. Each of the gate electrodes 273 may include a low-resistance metal, such as tungsten, so as to achieve low-resistance wiring. Each of the gate electrodes 273 may further include a barrier layer, such as a titanium nitride layer, a tungsten nitride layer, or a tantalum nitride layer.

As described with reference to FIGS. 7D and 7E, the cell stack structure CS may be formed by replacing portions of the second material layers, which overlap with the first region A1 of the substrate 201, with the gate electrodes 273 through the slit SI.

Referring back to FIG. 7E, a spacer insulating layer 275 covering a sidewall of the cell stack structure CS may be formed on a sidewall of the slit SI. A bottom surface of the slit SI is left exposed by the spacer insulating layer 275. The second doped semiconductor layer 259 of the preliminary source structure PST may be exposed through the bottom surface of the slit SI.

Figure 7F:
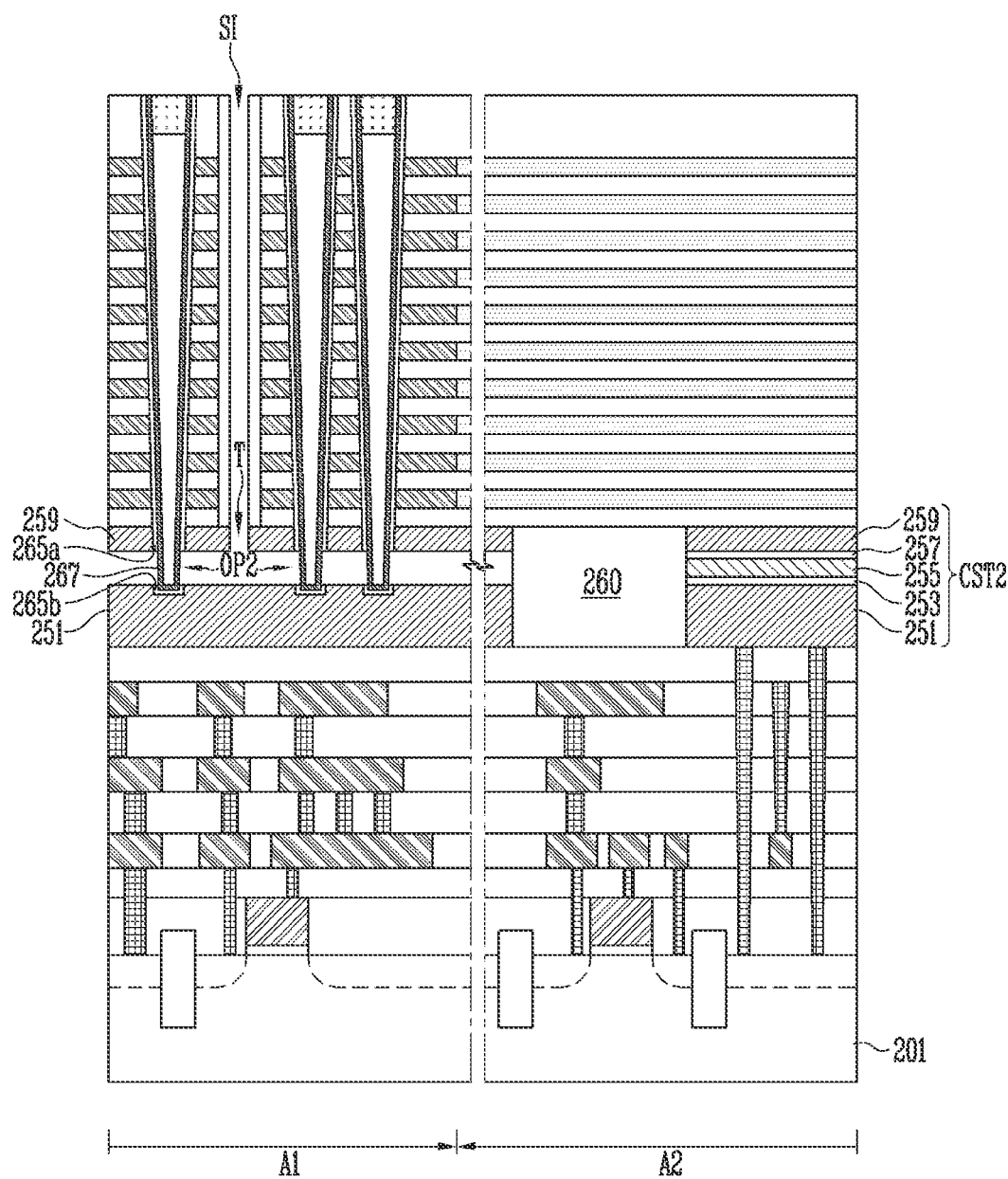

Referring to FIG. 7F, a trench T may be formed, which exposes the sacrificial layer 255 of the preliminary source structure PST shown in FIG. 7D. The trench T may be connected to the slit SI, and may penetrate the second doped semiconductor layer 259 and the second insulating layer 257 of the preliminary source structure PST shown in FIG. 7E.

Subsequently, the sacrificial layer 255 of the preliminary source structure PST shown in FIG. 7E may be removed through the trench T. The first insulating layer 253 and the second insulating layer 257 of the preliminary source structure PST shown in FIG. 7E may protect the first doped semiconductor layer 251 and the second doped semiconductor layer 259 of the preliminary source structure PST.

Subsequently, a portion of the exposed memory layer may be removed by removing the sacrificial layer 255 of the preliminary source structure PST. A region from which the sacrificial layer 255, the first insulating layer 253, and the second insulating layer 257 of the preliminary source structure PST and a portion of the memory layer are removed may be defined as a second opening OP2.

The memory layer may be separated into a first memory pattern 265a and a second memory pattern 256b through the second opening OP2, and a sidewall of the channel layer 267 may be exposed through the second opening OP2.

While the second opening OP2 is formed, the separation layer 260 may protect, from an etching process, the sacrificial layer 255, the first insulating layer 253, and the second insulating layer 257 of the second capacitor structure CST2 disposed on the second region A2 of the substrate 201.

Figure 7G:
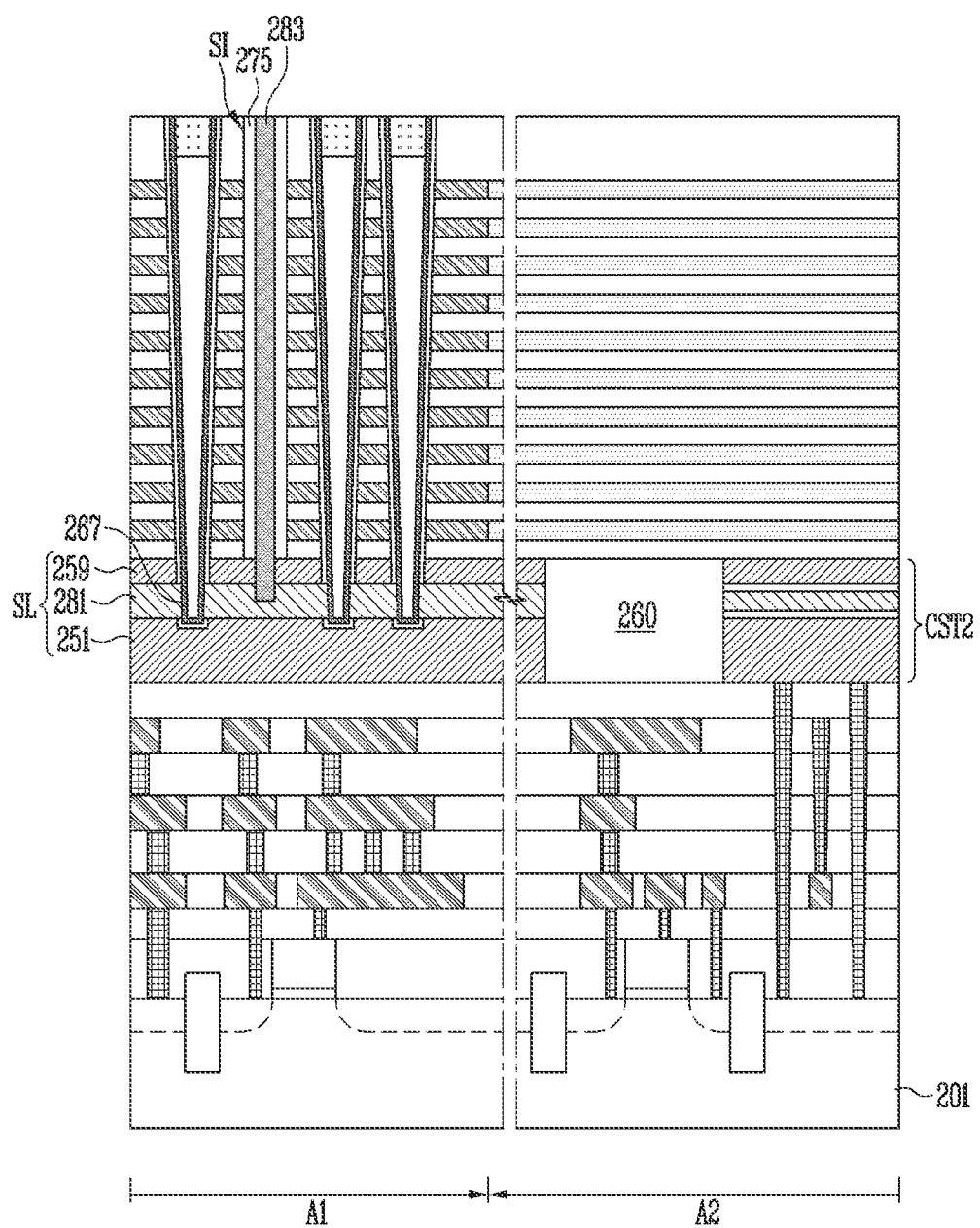

Referring to FIG. 7G, the second opening OP2 described with reference to FIG. 7F is filled with a contact source layer 281. The contact source layer 281 may be in contact with each of the channel layer 267, the first doped semiconductor layer 251, and the second doped semiconductor layer 259.

The contact source layer 281 may be formed by using a chemical vapor deposition process, or be formed by using a growth process using each of the channel layer 267, the first doped semiconductor layer 251, and the second doped semiconductor layer 259 as a seed layer. The contact source layer 281 is a doped semiconductor layer, and may include, for example, a doped silicon layer. The first doped semiconductor layer 251, the contact source layer 281, and the second doped semiconductor layer 271, which are disposed on the first region A1 of the substrate 201, may form a source structure SL. An impurity in the contact source layer 281 may be diffused into the channel layer 267 through a thermal process.

As described with reference to FIGS. 7F and 7G, the source structure SL may be formed by using a technique of replacing the sacrificial layer 255, the first insulating layer 253, and the second insulating layer 257 of the preliminary source structure PST shown in FIG. 7E with the contact source layer 281 through the trench T shown in FIG. 7F.

Referring back to FIG. 7G, after the source structure SL is formed, the slit SI may be filled with a source contact structure 283. The source contact structure 283 is formed on the spacer insulating layer 275, and is in contact with the contact source layer 281. The source contact structure 283 is formed of a conductive material.

Figure 7H:
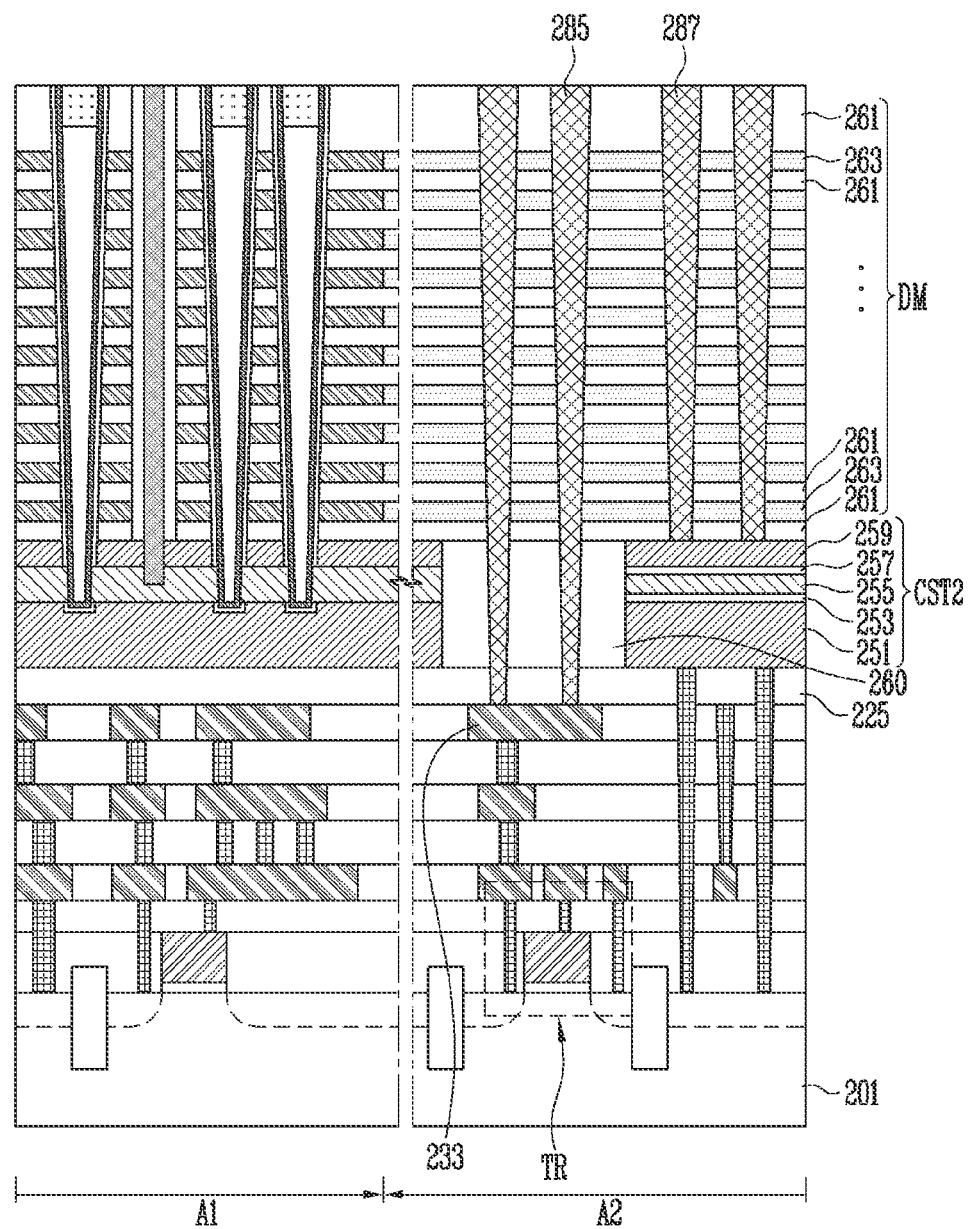

Referring to FIG. 7H, a peripheral contact plug 285 penetrating the dummy stack structure DM and the separation layer 260 may be formed. The peripheral contact plug 285 may extend to the inside of a portion (e.g., 225) of the lower insulating layer to be in contact with a lower line 233 connected to a transistor TR of the peripheral circuit structure.

Subsequently, a second capacitor node contact 287 may be formed, which penetrates the dummy stack structure DM and is in contact with the second doped semiconductor layer 259 of the second capacitor structure CST2.

The peripheral contact plug 285 and the second capacitor node contact 287 may be simultaneously formed. The peripheral contact plug 285 is formed of a conductive material.

FIGS. 7A to 7H illustrate a case where the semiconductor memory device includes the second capacitor structure and the first and second capacitor node contacts, which are shown in FIG. 5A. A case where the semiconductor memory device includes the second capacitor structure and the first and second capacitor node contacts, which are shown in each of FIGS. 5B to 5F, may be formed through application and modification of the processes described with reference to FIGS. 7A to 7H.

Figure 8:
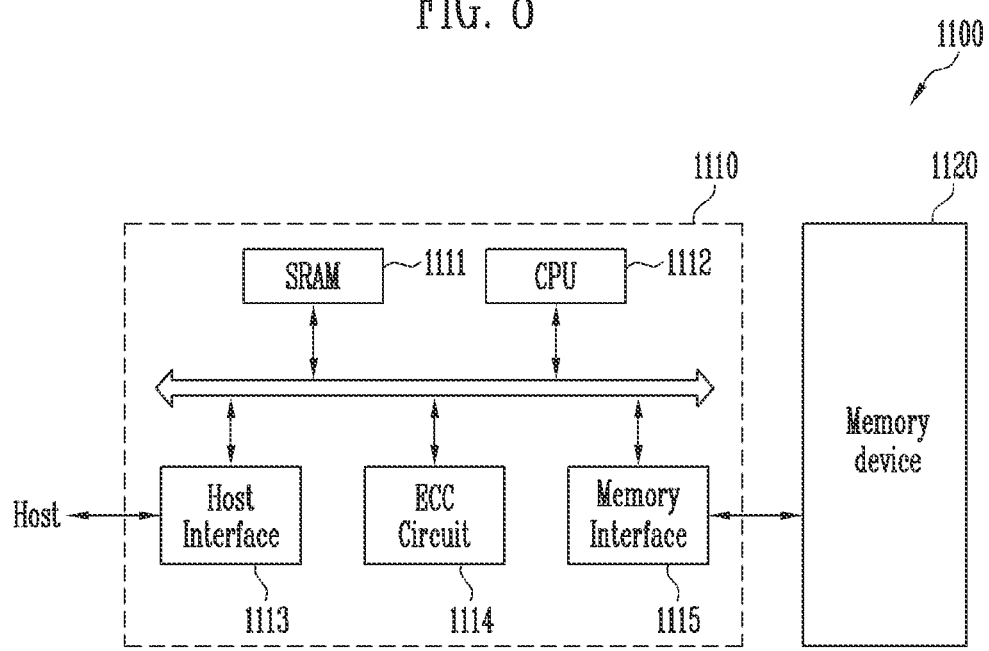
FIG. 8 is a block diagram illustrating a configuration of a memory system in accordance with an embodiment of the present disclosure.

FIG. 8 is a block diagram illustrating a configuration of a memory system 1100 in accordance with an embodiment of the present disclosure.

Referring to FIG. 8, the memory system 1100 includes a memory device 1120 and a memory controller 1110.

The memory device 1120 may be a multi-chip package configured with a plurality of flash memory chips. The memory device 1120 may include the cell stack structure and the capacitor structures, which are described with reference to FIGS. 2, 3, and 6. The capacitor structures may include at least one of the structures described with reference to FIGS. 3, 4A to 4C, and 5A to 5F.

The memory controller 1110 is configured to control the memory device 1120, and may include a static random access memory (SRAM) 1111, a CPU 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 9:
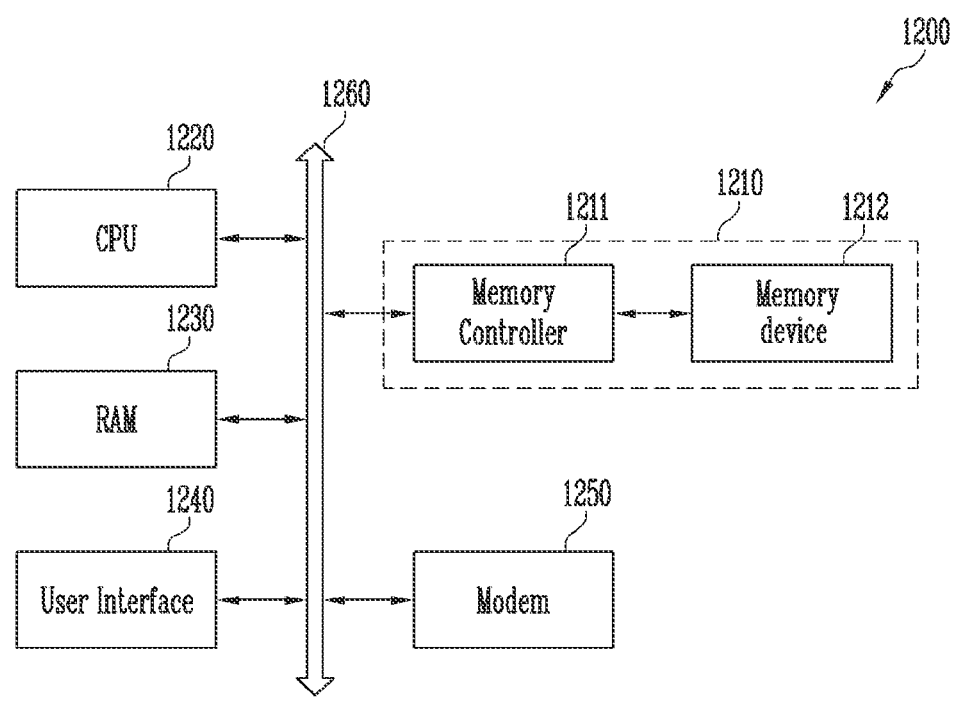
FIG. 9 is a block diagram illustrating a configuration of a computing system in accordance with an embodiment of the present disclosure.

FIG. 9 is a block diagram illustrating a configuration of a computing system 1200 in accordance with an embodiment of the present disclosure.

Referring to FIG. 9, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211.

In accordance with the present disclosure, a capacitor structure is formed by using a stack structure provided for a source structure, so that the capacitance of a capacitor may be secured.

In accordance with the present disclosure, a capacitor structure is formed by using doped semiconductor layers remaining between a dummy stack structure and a substrate, so that the capacitance of a capacitor can be increased without any increase in chip size.

Presented embodiments of the present disclosure have been illustrated and described in the drawings and written description. Although specific terminologies are used here, they are only used to explain the presented embodiments. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood to have by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor memory device, the method comprising:
    forming a first stack structure by sequentially stacking a first doped semiconductor layer, a sacrificial layer, and a second doped semiconductor layer on a substrate;
    forming a separation layer that separates the first stack structure into a preliminary source structure on a first region of the substrate and a capacitor structure on a second region of the substrate;
    forming a trench that exposes the sacrificial layer of the preliminary source structure in the first region; and
    replacing the sacrificial layer of the preliminary source structure with a contact source layer through the trench, wherein the sacrificial layer of the capacitor structure is maintained.

2. The method of claim 1, further comprising, before the first stack structure is formed, forming transistors on the substrate,
    wherein the transistors are disposed in a lower insulating layer and constitute a peripheral circuit, and
    wherein the first stack structure is formed on the lower insulating layer.

3. The method of claim 2, further comprising, before the first stack structure is formed, forming a first capacitor node contact that penetrates the lower insulating layer and connects to the second region of the substrate.

4. The method of claim 1, wherein forming the first stack structure further includes:
    forming a first insulating layer on the first doped semiconductor layer before the sacrificial layer is formed; and
    forming a second insulating layer on the sacrificial layer before the second doped semiconductor layer is formed.

5. The method of claim 4 further comprising replacing the first insulating layer and the second insulating layer of the preliminary source structure with the contact source layer through the trench.

6. The method of claim 1, wherein the sacrificial layer comprises a material having an etching rate different from an etching rate of the first doped semiconductor layer and the second doped semiconductor layer.

7. The method of claim 1, further comprising:
before the forming of the trench,
alternately stacking first material layers and second material layers on the second doped semiconductor layer, wherein each of the first and second material layers extends to overlap the separation layer, the preliminary source structure, and the capacitor structure;
forming channel layers that penetrate the first material layers and the second material layers and extend to the inside of the preliminary source structure;
forming a slit that penetrates the first material layers and the second material layers between the channel layers; and
replacing the second material layers on the first region of the substrate with gate electrodes through the slit.

8. The method of claim 7, further comprising forming a second capacitor node contact that penetrates the first material layers and the second material layers on the second region of the substrate and is in contact with the second doped semiconductor layer of the capacitor structure.

* * * * *